US005854468A

United States Patent [19]
Muka

[11] Patent Number: 5,854,468
[45] Date of Patent: Dec. 29, 1998

[54] SUBSTRATE HEATING APPARATUS WITH CANTILEVERED LIFTING ARM

[75] Inventor: Richard S. Muka, Topsfield, Mass.

[73] Assignee: Brooks Automation, Inc., Chelmsford, Mass.

[21] Appl. No.: 591,278

[22] Filed: Jan. 25, 1996

[51] Int. Cl.[6] .............................. H05B 3/68; F27B 5/14; C23C 14/00

[52] U.S. Cl. .................... 219/443; 219/390; 204/298.25

[58] Field of Search .................. 219/443, 411, 219/405, 385, 390; 432/239, 241, 26; 118/715; 204/298.25, 792.12; 156/345; 198/19; 414/225

[56] References Cited

U.S. PATENT DOCUMENTS

| | | |
|---|---|---|
| 3,973,665 | 8/1976 | Giammanco ............................. 198/19 |
| 4,208,159 | 6/1980 | Uehara et al. ........................... 414/225 |
| 4,534,816 | 8/1985 | Chen et al. .............................. 156/345 |
| 4,597,736 | 7/1986 | Moffat ....................................... 432/26 |
| 4,923,584 | 5/1990 | Bramhall, Jr. et al. ............ 204/298.25 |
| 4,951,601 | 8/1990 | Maydan et al. ......................... 118/719 |
| 4,952,299 | 8/1990 | Chrisos et al. ..................... 204/298.25 |
| 5,013,385 | 5/1991 | Maher et al. ............................ 156/345 |
| 5,019,233 | 5/1991 | Blake et al. ........................ 204/792.12 |
| 5,060,354 | 10/1991 | Chizinsky ............................... 29/25.02 |
| 5,252,807 | 10/1993 | Chizinsky ................................. 219/390 |

*Primary Examiner*—Robert E. Nappi
*Assistant Examiner*—Rajnikant B. Patel
*Attorney, Agent, or Firm*—Perman & Green, LLP

[57] ABSTRACT

An apparatus for heating substrates having a frame forming a vacuum chamber, a heater, a lift mechanism and a lift arm. The lift arm has a general "Y" shape and is located in a groove in a top heat transfer surface of the heater. The lift arm extends out of the groove at a lateral side of the heater and is connected to the lift mechanism.

22 Claims, 3 Drawing Sheets

SUBSTRATE HEATING APPARATUS WITH CANTILEVERED LIFTING ARM

BACKGROUND OF THE INVENTION

1. Field of the Invention

The present invention relates to a heater for a substrate and, more particularly, to a heating apparatus with an arm to move a substrate relative to a heat transfer surface.

2. Prior Art

U.S. Pat. Nos. 4,923,584; 4,952,299 and 5,019,233 disclose a platen assembly with channels formed in a surface of the platen to supply gas to effect gas conduction cooling of a wafer, a heating element, a temperature probe, thermal insulating material, and pins on a ring for moving a wafer onto the surface of the platen. U.S. Pat. Nos. 5,060,354; 5,252,807 and 4,597,736 disclose thermal processors for semiconductor wafers. U.S. Pat. No. 4,534,816 discloses a single wafer plasma etch reactor. U.S. Pat. No. 5,013,385 discloses a system with multiple single wafer plasma reactors.

The following U.S. Patents disclose various methods of moving substrates:

| | |
| --- | --- |
| U.S. Pat. No. : 3,973,665 | U.S. Pat. No. : 4,208,159 |
| U.S. Pat. No. : 4,534,816 | U.S. Pat. No. : 4,951,601 |
| U.S. Pat. No. : 5,013,385 | |

SUMMARY OF THE INVENTION

In accordance with one embodiment of the present invention, a substrate heating apparatus is provided comprising a frame, a heater, a lift arm and a lift mechanism. The frame forms a vacuum chamber. The heater has a heating surface located in the vacuum chamber. The heating surface has grooves along the heating surface. The lift arm is located in at least one of the grooves and extends out of the at least one groove at a lateral side of the heater. The lift mechanism is connected to the frame and the lift arm for moving the lift arm in and out of the at least one groove, at least partially, past a top of the heating surface.

In accordance with another embodiment of the present invention, a substrate heating apparatus is provided comprising means for passive gas heat conduction and means for moving a substrate. The means for passive gas heat conduction includes a heating plate with a heat transfer surface having gas conduit grooves therealong and standoffs extending from the heat transfer surface for holding a substrate at a spaced distance from the heat transfer surface. The means for moving a substrate can move the substrate onto and off of the standoffs and comprises a lifting arm. The lifting arm has a lower position inside a first one of the grooves. The lifting arm extends out of the first groove from a lateral side of the heating plate to a movement mechanism.

BRIEF DESCRIPTION OF THE DRAWINGS

The foregoing aspects and other features of the invention are explained in the following description, taken in connection with the accompanying drawings, wherein.

DETAILED DESCRIPTION OF THE PREFERRED EMBODIMENT

Figure 1:
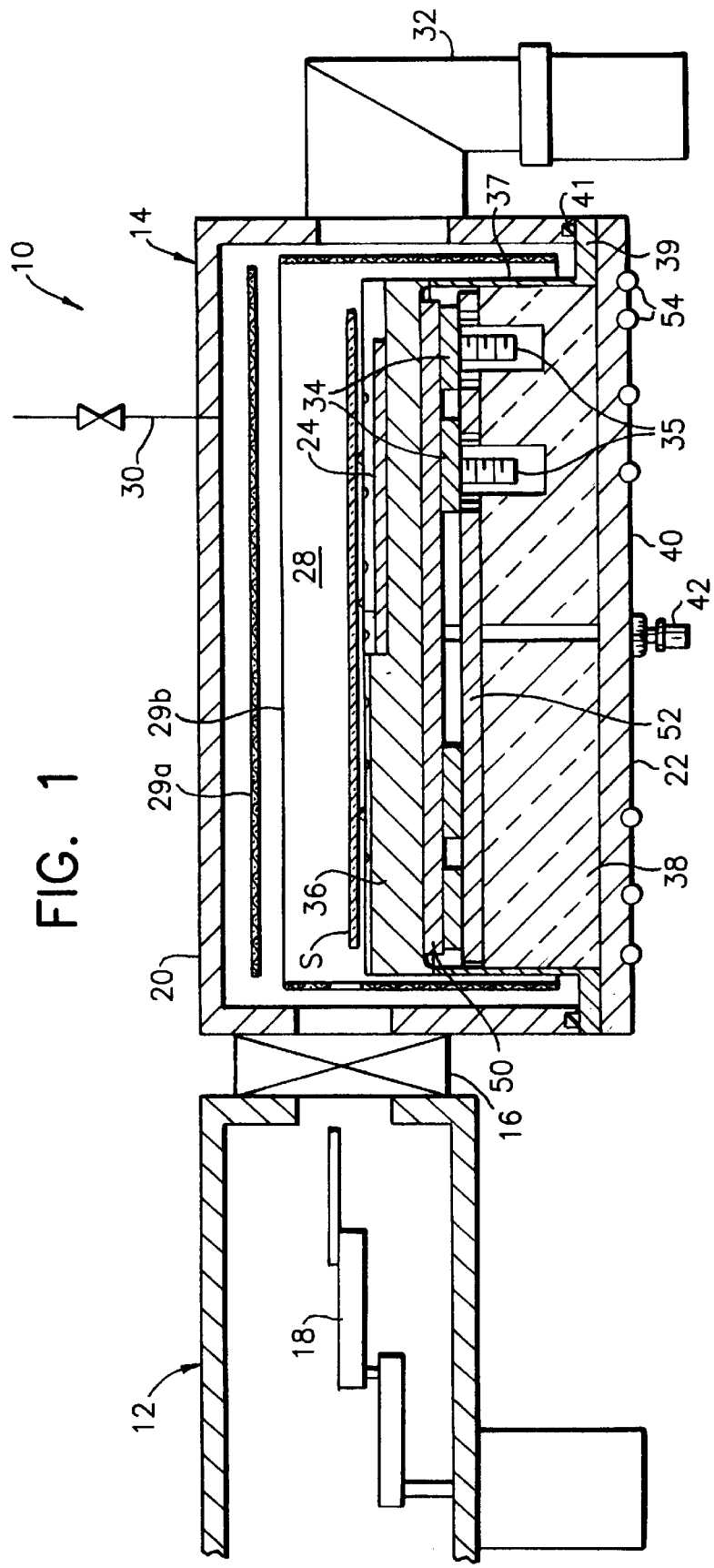
FIG. 1 is a partial schematic cross-sectional view of a substrate processing apparatus having a substrate heating apparatus incorporating features of the present invention.

Referring to FIG. 1, a partial schematic cross-sectional view of a substrate processing apparatus 10 is shown. Although the present invention will be described with reference to the single embodiment shown in the drawings, it should be understood that features of the present invention can be embodied into various different forms of alternate embodiments. In addition, any suitable size, shape or type of elements or materials could be used.

The processor 10 generally comprises a substrate transport 12, a substrate heating apparatus 14, processing modules (not shown) and a substrate cassette elevator (not shown). The heating apparatus 14 is connected to the substrate transport 12 with a door or lock 16 between the two. The transport 12 has a movement mechanism 18 that can extend through the door 16 when it is open to insert or remove a substrate S from inside the heating apparatus 14. The heating apparatus 14 can be used with any suitable type of substrate, such as a semiconductor wafer or a flat panel for a display.

Figure 2:
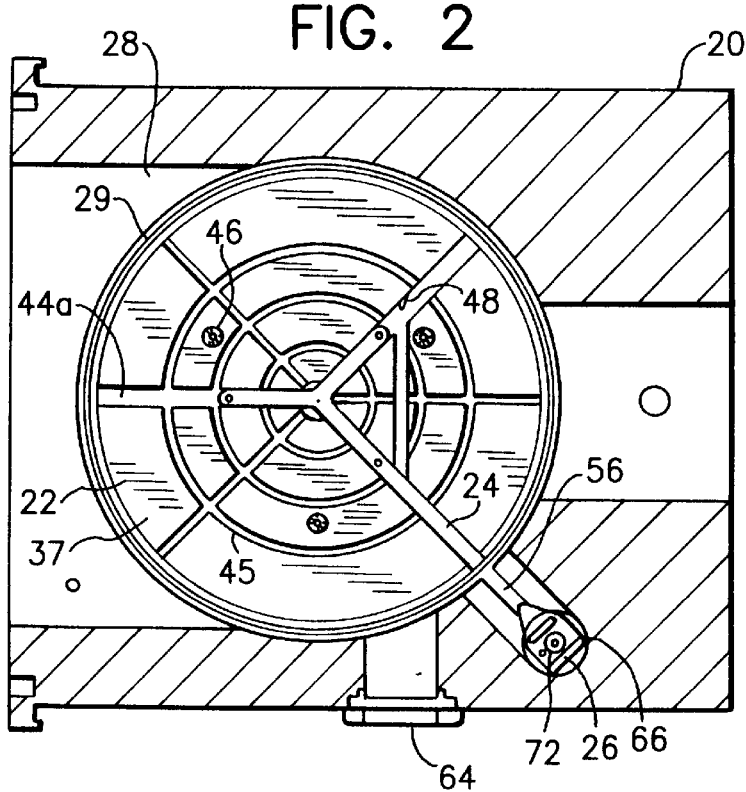
FIG. 2 is a cross-sectional view of the frame of the heating apparatus shown in FIG. 1 showing a top plan view of the heater and the lift arm.
Figure 3:
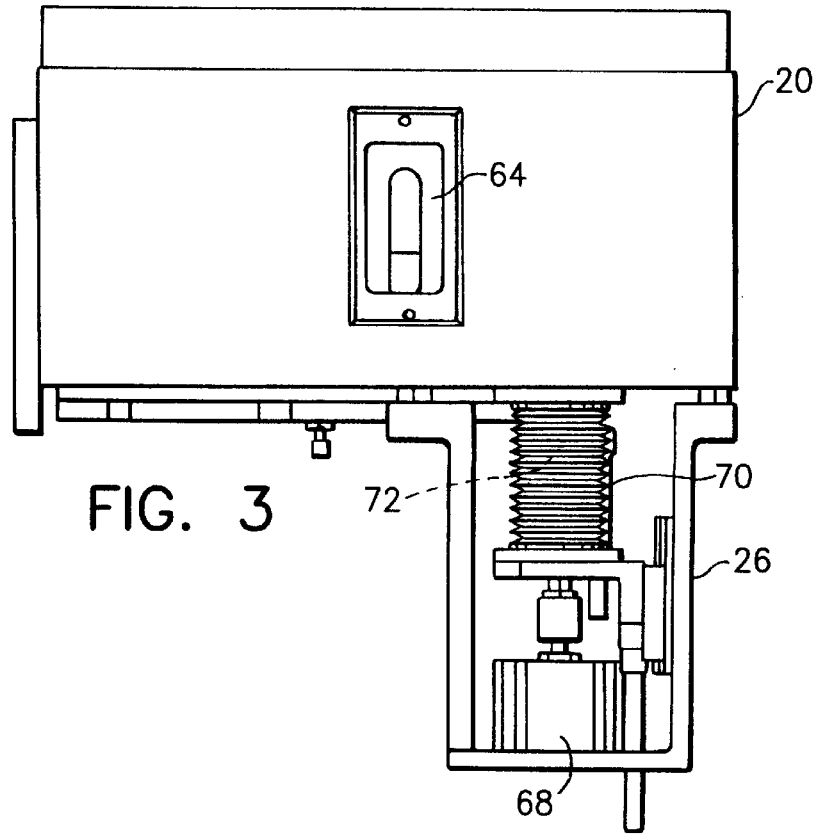
FIG. 3 is an elevational side view of the frame shown in FIG. 2 and a portion of the lift mechanism.

Referring also to FIGS. 2 and 3, the heating apparatus 14 is a single member heater and includes a frame 20, a heater or heater assembly 22, a lift arm 24 and a lift mechanism 26. The frame 20 forms a chamber 28 therein for receiving the substrate S. Connected to the frame 20 is a gas supply line 30 and a vacuum line 32. The gas supply line 30 is connected to a supply of gas, such as an inert gas. The vacuum line is connected to a source of vacuum. Thus, the chamber 28 can be supplied with gas to allow for heat transfer through the gas and the gas can be evacuated after heat transfer is complete. Located in the chamber 28 are heat shields 29a, 29b on the top and sides of the heater assembly 22. A side of the frame 20 has a view port 64. The frame 20 also has an aperture 66 through to its bottom. A portion of the lift mechanism 26 is located in the aperture 66.

Figure 4:
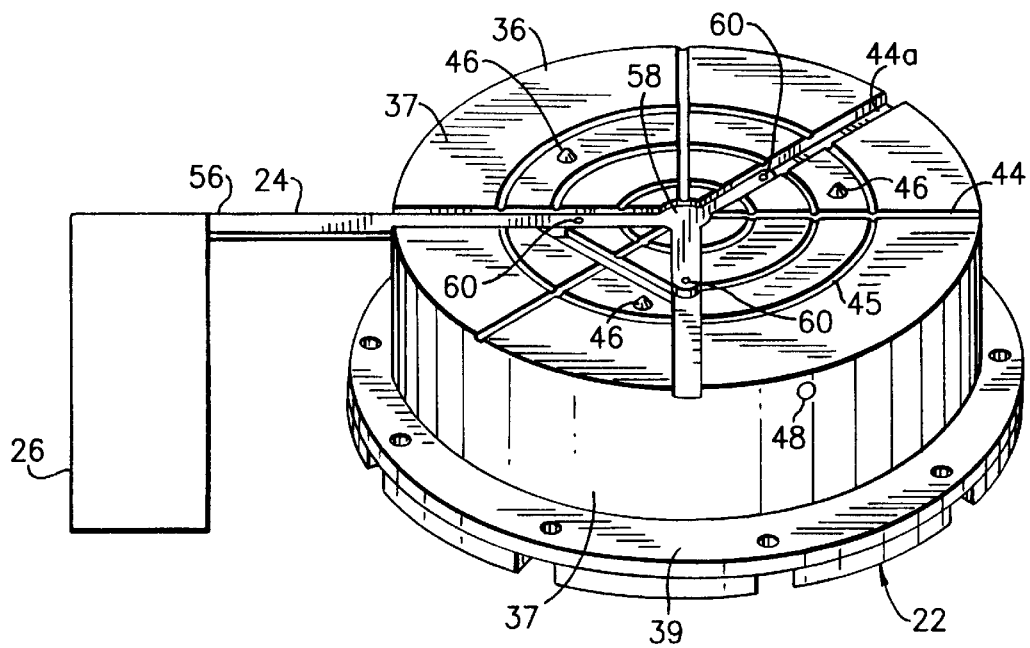
FIG. 4 is a perspective view of the heater of the substrate heating apparatus shown in FIG. 1 with the lift arm and a schematic view of the lift mechanism.

The heater assembly 22 generally comprises heating elements 34, a heating plate 36, an insulator 38, a cooling plate 40, and a probe 42. Referring also to FIG. 4, the top surface 37 of the heating plate 36 includes two sets of grooves 44, 45 and three substrate mounts or standoffs 46. The mounts 46 extend up from the top surface 37 of the heating plate 36. The first set of grooves 44 are straight and include a general "Y" shaped section 44a which is seen best in FIG. 2. The second set of grooves 45 are generally circular and intersect with the first set of grooves 44. The mounts 46 have point tips and extend above the top surface 37 about 0.1 mm to about 0.05 mm. The heating plate 36 also has an angled optic beam hole 48 from the lateral side of the assembly 22 through to the top surface 37. The angled hole 48 is used with a light beam and light sensor (not shown) to signal the presence or absence of a substrate on top of the assembly 22. Mounted between the top of the heating elements 34 and the bottom of the heating plate 36 is a heat distribution plate 50. The plate 50 is preferably made of copper and is provided to distribute heat from the heating elements 34 along the bottom of the heating plate 36. A heat element mounting plate 52 is provided between the bottom of the heating elements 34 and the top of the insulator 38. The heating elements 34 have electrical terminals 35 that extend into the insulator 38. The insulator is preferably a ceramic fiber. However, any suitable type of insulator could be used. Multiple layers of insulation could also be used. The cooling plate 40 is located below the insulator 38.

The cooling plate 40 includes coolant conduit lines 54 along its bottom that are connected to a heat exchanger (not shown). Thus, heat that is transferred to the cooling plate 40 can be removed by the coolant flowing in the conduit lines 54. The probe 42 extends up through the assembly 22 to the heating plate 36. The probe 42 is preferably a spring loaded thermocouple probe. Extending between the heating plate 36 and the cooling plate 40 is a side wall 37. The side wall 37 has a thin cross-sectional width except at its base 39. The base 39 is fixedly attached to the frame 20 of the heating apparatus 14. A seal 41 is provided between the bottom of the frame 20 and the top of the base 39 to seal off the chamber 28. The thin width of the side wall 37 forms a thermal choke to prevent heat from the heating plate 36 from overheating, melting or destroying the seal 41. The thermal choke also helps to minimize heat loss from the heating plate 36. The thermal choke also prevents excessive radial temperature gradient of the heating plate. In other words, heat losses at the perimeter of the heating plate 36 are kept low to keep the temperature of the heating plate substantially radially uniform along the top surface 37.

The lift arm 24 has a first end 56 connected to the lift mechanism 26. The lift arm 24 extends from the lift mechanism 26 in a general cantilevered fashion. The second end 58 of the arm 24 has a general "Y" shape. The arm 24 is suitably sized and shaped to be located in the "Y" shaped section 44a of the grooves 44. When located in the section 44a, a section of the arm 24 extends out of the grooves 44 at the lateral side of the assembly 22. The second end 58 of the arm 24 has three upwardly extending contact points 60 for contacting the bottom side of the substrate. The arm 24 could have more than three contact points 60, such as for use with a slightly flexible flat panel substrate. Likewise, the heating plate 36 could have more than three mounts 46, such as for use with a slightly flexible flat panel substrate to prevent the substrate from drooping or sagging onto the top surface 37. The length of the lift arm extends along over half the width of the top surface 37.

Referring to FIGS. 2 and 3, the lift mechanism 26 is mounted to the bottom of the frame 20. The lift mechanism 26 includes a drive 68, a flexible bellows seal 70, and a driven section 72. Any suitable type of drive could be provided. The driven section 72 extends up through the aperture 66 in the frame 20. The drive 68 is adapted to move the driven section 72 vertically up and down. The first end 56 of the lift arm 24 is connected to the driven section 72. Therefore, when the driven section 72 is moved up and down, the lift arm 24 is moved up and down.

Figure 5:
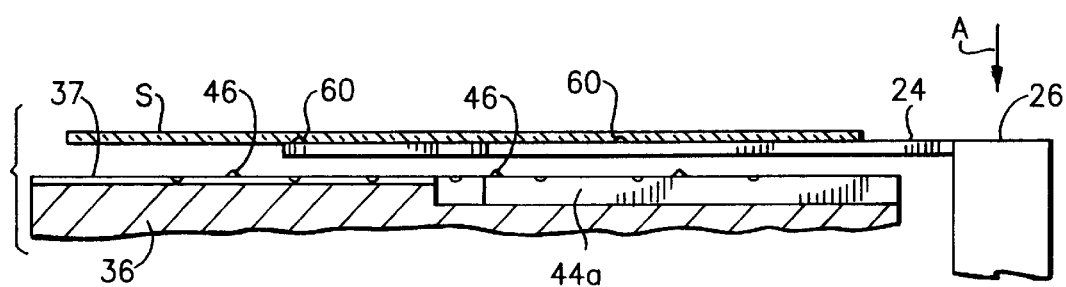
FIG. 5 is a partial schematic cross-sectional view of the heater shown in FIG. 4 with the lift arm raised by the lift mechanism.

FIGS. 1 and 4 show the lift arm 24 located in a retracted or lower position inside the grooves 44. FIG. 5 shows the lift arm 24 located in an extended or upper position above the top surface 37 of the heating plate 36. When the arm 24 is located in its upper position the substrate S is supported on the top tips of the contact points 60. In a preferred embodiment the contact points 60 are comprised of quartz. This upper position allows the movement mechanism 18 to either deposit the substrate S onto the lift arm 24 or remove a heated substrate from the lift arm. When the lift mechanism 26 lowers the lift arm 24 to its lower position, as indicated by arrow A in FIG. 5, the lift arm retracts into the grooves 44. The bottom of the substrate S comes into contact with the mounts 46. The mounts 46 are also preferably comprised of quartz. As the substrate S contacts the mounts 46, the contact points 60 are lowered off of the bottom of the substrate S. Due to the small height of the mounts 46, the substrate S is located in very close proximity to the top surface 37 of the heating plate 36, such as at a distance of about 0.1 mm to about 0.05 mm.

After the substrate S is located on the mounts 46 and the door 16 is closed, inert gas is supplied to the chamber 28. The grooves 44, 45 act as a gas transport manifold to allow the gas to quickly travel between the bottom of the substrate and the top surface 37. The grooves are preferred because the very small gap between the top surface 37 and the bottom of the substrate would otherwise take a relatively long time to fill with gas. In addition, the gas is preferably injected to a pressure of only about 50 Torr. This low pressure conserves use of gas which may be expensive, such as for inert gas. More importantly, use of a minimal amount of gas is preferred in order to minimize gas turbulence inside the chamber 28. Gas flow in the chamber 28 can cause particulate contaminants in the chamber 28 to be moved onto a substrate. The greater the gas turbulence, the greater the risk of moving particulates and the greater the risk of substrate contamination. Therefore, only a small amount of gas is introduced into the chamber 28 to reduce the risk of particulate contamination of the substrates. It has been found that conductivity of the gas at 50 Torr is about 80% of conductivity for 750 Torr (one atmosphere). This low pressure of gas allows heat transfer at a rate of about 80% of normal atmospheric pressure, but allows the chamber 28 to be both filled and evacuated relatively quickly. The time saving in filling and evacuating more than compensates for the reduced conductivity rate, speeds up the overall time it takes between entry and exit of a substrate, and conserves use of gas.

Because of the very close proximity of the bottom of the substrate to the top surface 37 heat is primarily transferred to the substrate by gas conduction heat transfer. This is described in U.S. patent applications Ser. Nos. 08/145,343 and 08/480,128 which are hereby incorporated by reference in their entireties. In an alternate embodiment the mounts 46 need not be provided if the substrate is maintained on the contact points 60 when the arm 24 is lowered. However, in such an alternate embodiment, very precise locating of the arm 24 would be necessary in order to establish the predetermined gap between the top surface 37 of the heating plate 36 and the bottom of the substrate S to insure that gas conduction heat transfer can occur. Since the predetermined gap may be as small as 0.05 mm, such an alternate embodiment may not be practical for such small substrates. The reasons for the small gap are to allow for optimum heat conduction and also to prevent the substrate from being contaminated by particulates on the top surface 37. Over a prolonged time, with numerous substrates being introduced and removed from the heating apparatus 14, particulates will accumulate on the top surface 37. Thus, the substrates should not touch the top surface 37. The mounts 46 keep the bottom surface of the substrates spaced from the top surface 37 and thereby prevent the substrates from being contaminated by particulates on the top surface 37. The mounts 46 are preferred because they keep the gap constant for all of the substrates. Thus, the repeatability of the constant single gap for all of the substrates provides a uniform repeatable rate of heating of the substrates.

The heater assembly 14 of the present invention is generally provided for use in an open loop control system. A closed loop control system generally measures the temperature of a substrate being heated and adjusts the temperature of the heater accordingly. A closed loop control system has many problems including contacting the substrate with a temperature probe, which risks contaminating the substrate, and potential overheating of the substrate. Direct temperature measurements of the substrate in a closed loop action control system also has problems in regard to substrate surface reflectivity. Some substrate temperature probes used in the past are not accurate below 400° C. Some applications are below 400° C. The open loop control system of the present invention does not monitor the temperature of the substrate. Instead, the present invention merely keeps the heating plate 36 at a constant target temperature desired for the substrate. Thus, the control of heating of the substrate is passive. There is no risk of overheating because once the substrate reaches the target temperature it will merely stay at that temperature until removed by the movement mechanism 18. There is no risk of particulate contamination by contacting the substrate with a temperature probe the substrate is not contacted by a temperature probe. The open loop control system of the present invention is also insensitive to substrate surface characteristics, such as reflectivity.

One of the principal features of the present invention is the use of the cantilevered lift arm 24 to raise and lower substrates off of and onto the heater assembly 22. The heating apparatus 14 has the lift mechanism 26 laterally spaced from the heater assembly 22. This is intentionally done in order to reduce unnecessary heating of the lift mechanism 26 by the heater assembly 22. Locating the lift mechanism 26 outward from the heater assembly 22 allows the heater assembly 22 to have a simpler construction. This also simplifies replacement of parts in the lift mechanism 26 and the heater assembly 22. Only the one seal 70 is needed for the lift mechanism 26 rather than three or more seals that would otherwise be needed if the lift arm and lift mechanism passed through the heater. Locating the lift mechanism 26 away from the heater assembly 22 also places the seal 70 in a relatively cool location to prevent overheating of the seal by the heating assembly 22.

In order to properly support a substrate, the cantilevered arm 24 extends more than half the width of the top surface 37 and is used with the three spaced contact points 60. The general "Y" shape of the second end 58 of the arm 24 provides adequate support for the substrate S while minimizing the amount of area that the arm will occupy when recessed in the grooves 44. However, in alternate embodiments, arms with other shapes or combinations of shapes could be provided. Preferably, the grooves 44, 45 only occupy about 5% of the total area of the top surface 37. Because the arm 24 is relatively lightweight, the drive 68 of the lift mechanism 26 can be relatively small. Unlike old designs for substrate lifting and lowering arms, the cantilevered arm of the present invention, by extending more than half the width of the top surface of the heating assembly and perhaps having more than three contact mounts, can adequately support larger substrates without risk of the substrates sagging onto the top surface. This can be especially important for flat panel display substrates that are slightly flexible. Mere perimeter support of such flat panel display substrates would not adequately prevent the substrates from drooping onto the top surface and being contaminated by particulate contaminates.

It is important to keep the size of the chamber 28 as small as possible to minimize the amount of gas that needs to be introduced. Therefore, locating the lift mechanism 26 outside the chamber 28 helps to keep the chamber small. The gap between the side wall 37 and the perimeter shield 29b is also small in order to keep the size of the chamber 28 small. The shields 29a, 29b help to contain waste heat such that no additional cooling system is needed for the sides of the frame 20, they reduce worker safety hazard, they help to reduce power consumption, they protect seals and they reduce heat transfer to other parts of the apparatus 10.

The design of the heater assembly 22 and its attachment to the bottom of the frame 20 provides other advantages. In particular, repair and replacement of components of the assembly 22 is much easier. The base 39 is kept attached to the frame 20. Thus, the chamber 28 is kept sealed at the seal 41. The cooling plate 40 can be removed to thereby gain access to the insulator 38 and heating elements 34 without breaking the seal 41 at the bottom of the frame 20. This embodiment also allows use of any suitable type of heating element; not necessarily a heating element designed for a vacuum environment.

It should be understood that the foregoing description is only illustrative of the invention. Various alternatives and modifications can be devised by those skilled in the art without departing from the spirit of the invention. Accordingly, the present invention is intended to embrace all such alternatives, modifications and variances which fall within the scope of the appended claims.

What is claimed is:

1. A substrate heating apparatus comprising:
   a frame forming a chamber;
   a heater having a heating surface located in the chamber, the heating surface having grooves along the heating surface;
   a lift arm located in at least one of the grooves and extending out of the at least one groove at a lateral side of the heater; and
   a lift mechanism connected to the frame and the lift arm for moving the lift arm in and out of the at least one groove past a top of the heating surface.

2. An apparatus as in claim 1 wherein the lift arm has a general "Y" shape.

3. An apparatus as in claim 1 wherein the lift arm has at least three upwardly extending contact points for contacting a substrate.

4. An apparatus as in claim 1 wherein the grooves include gas conduit grooves that intersect with the at least one groove.

5. An apparatus as in claim 1 wherein the at least one groove has a general "Y" shape.

6. An apparatus as in claim 1 wherein the heating surface has three point contacts extending from the heating surface that support a substrate a predetermined distance from the heating surface.

7. An apparatus as in claim 1 wherein the heater further comprises a heating element, a cooling plate and an insulator between the heating element and cooling plate.

8. An apparatus as in claim 1 further comprising means for passive gas heat conduction including the heating surface having gas conduit grooves therealong and standoffs extending from the heating surface for holding a substrate at a spaced distance from the heating surface of about 0.05 mm to about 0.1 mm.

9. An apparatus as in claim 1 wherein the lift mechanism is located at a lateral side of the heater.

10. An apparatus as in claim 9 wherein the lift arm has an end that is connected to the lift mechanism at the lateral side of the heater.

11. An apparatus as in claim 1 wherein the lift arm is a single lift arm, is orientated parallel to the heating surface, and is the only lift arm connected to the lift mechanism.

12. An apparatus as in claim 7 wherein the heating surface is connected to the frame by a side wall of the heater with a seal between the side wall and the frame, wherein the cooling plate, insulator and heating element can be removed without disturbing the seal between the frame and the side wall.

13. An apparatus as in claim 12 wherein the side wall of the heater is thin to form a thermal choke and the side wall seal and heating surface seal off the bottom of the chamber.

14. A substrate heating apparatus comprising:

means for passive gas heat conduction including a heating plate with a heat transfer surface having gas conduit grooves therealong and standoffs extending from the heat transfer surface for holding a substrate at a spaced distance from the heat transfer surface;

and means for moving a substrate onto and off of the standoffs comprising a lifting arm that has a lower position inside a first one of the grooves and that extends out of the first groove from a lateral side of the heating plate to a movement mechanism.

15. An apparatus as in claim 14 wherein the lift arm has a general "Y" shape.

16. An apparatus as in claim 14 wherein the lift arm has at least three upwardly extending contact points for contacting a substrate.

17. An apparatus as in claim 14 wherein the lift arm extends along at least half the width of the heat transfer surface.

18. An apparatus as in claim 14 wherein the lift arm is a single lift arm and the only lift arm of the means for moving.

19. An apparatus as in claim 14 further comprising a frame forming a substrate receiving chamber and means for removing a heating element below the heating plate without removing the heating plate from the chamber.

20. A substrate heating apparatus comprising:

a frame forming a chamber;

a heater having a heating surface located in the chamber, the heating surface having grooves along the heating surface;

a lift arm located in at least one of the grooves and extending out of the at least one groove at a lateral side of the heater;

a lift mechanism connected to the frame and the lift arm for moving the lift arm in and out of the at least one groove past a top of the heating surface; and wherein the lift arm extends along at least half the width of the heating surface.

21. A substrate heating apparatus as in claim 1 wherein the grooves are horizontally orientated along a top surface of the heating surface.

22. A substrate heating apparatus as in claim 14 wherein the heat transfer surface has horizontally orientated gas conduit grooves.

* * * * *